United States Patent
Chen et al.

(10) Patent No.: US 12,490,408 B1
(45) Date of Patent: Dec. 2, 2025

(54) LIQUID-COOLING COOLER

(71) Applicant: Shenzhen Simps Technologies Co., Ltd., Guangdong (CN)

(72) Inventors: Shuigen Chen, Guangdong (CN); Guolong Li, Guangdong (CN); Dasheng Zhang, Guangdong (CN)

(73) Assignee: Shenzhen Simps Technologies Co., Ltd., Shenzhen (CN)

( * ) Notice: Subject to any disclaimer, the term of this patent is extended or adjusted under 35 U.S.C. 154(b) by 0 days.

(21) Appl. No.: 19/333,373

(22) Filed: Sep. 19, 2025

(30) Foreign Application Priority Data

Aug. 20, 2025 (CN) .......................... 202511175071.X

(51) Int. Cl.
*F28F 7/00* (2006.01)
*H05K 7/20* (2006.01)

(52) U.S. Cl.
CPC ................ *H05K 7/20272* (2013.01)

(58) Field of Classification Search
CPC ................................ H05K 7/20272
USPC ...................................... 165/80.4
See application file for complete search history.

(56) References Cited

U.S. PATENT DOCUMENTS

2019/0124790 A1* 4/2019 Tufty ................. H05K 7/20263

FOREIGN PATENT DOCUMENTS

| CN | 208479346 U | * | 2/2019 |
| CN | 209030028 U | * | 6/2019 |
| TW | 202309405 A | * | 3/2023 |

* cited by examiner

*Primary Examiner* — Davis D Hwu

(57) ABSTRACT

The present disclosure proposes a liquid-cooling cooler, including a central housing, a water distribution plate, a mesh gasket, and a copper skived fin. The central housing is provided with a first groove, and the water distribution plate, and the mesh gasket, and the copper skived fin are sequentially stacked in the first groove. A water outlet is formed at the middle position of a side of the water distribution plate facing the copper skived fin. When flowing out of the water outlet, a coolant flows to the center of the copper skived fin through the water outlet, is dispersed around the copper skived fin by the copper skived fin, and then flows back to the central housing. A gap between the copper skived fin and the water distribution plate is isolated and sealed by the mesh gasket, preventing the water flow from flowing out from the middle.

10 Claims, 3 Drawing Sheets

LIQUID-COOLING COOLER

CROSS REFERENCE TO RELATED APPLICATIONS

The present application claims the benefit of Chinese Patent Application No. 202511175071.X filed on Aug. 20, 2025, the contents of which are incorporated herein by reference in their entirety.

TECHNICAL FIELD

The present disclosure relates to the technical field of heat dissipation devices, in particular to a liquid-cooling cooler.

BACKGROUND

In fields such as electronic devices and industrial machinery, a large amount of heat is generated during the operation of devices. If the heat cannot be dissipated in time, the performance and service life of the devices will be affected. At present, the commonly used heat dissipation methods include air cooling and water cooling. Liquid-cooling coolers, due to their high heat dissipation efficiency, are widely used in devices with high heat generation and high precision, such as CPUs and central controllers.

The existing liquid-cooling coolers have some shortcomings in structural design. For example, uneven distribution of water flow leads to poor heat dissipation effect; poor sealing performance between various components easily leads to water leakage; and relatively cumbersome assembly and maintenance of some liquid-cooling coolers increase the usage cost.

SUMMARY

In view of the above problems, the present disclosure is proposed to provide a liquid-cooling cooler that overcomes or at least partially solves the problems.

An embodiment of the present disclosure provides a liquid-cooling cooler, including a central housing, a water distribution plate, a mesh gasket and a copper skived fin.

The central housing is provided with a first groove, the water distribution plate, the mesh gasket and the copper skived fin are sequentially stacked in the first groove, and the copper skived fin is fixedly connected with the central housing.

A water outlet is formed at a middle position of a side of the water distribution plate facing the copper skived fin, a second groove is formed at a position of the water distribution plate corresponding to a mesh frame of the mesh gasket, and the mesh gasket is arranged in the second groove.

When flowing out of the water outlet, a coolant flows to the center of the copper skived fin through the water outlet, is dispersed around the copper skived fin by the copper skived fin, and then flows back to the central housing.

Further, the central housing includes a housing body and a centrifugal pump, the housing body is provided with a water inlet hole and a water outlet hole, the water inlet hole corresponds to the center of an impeller of the centrifugal pump, and the water outlet hole corresponds to the water outlet.

Further, the water distribution plate includes an upper water distribution plate and a lower water distribution plate.

The upper water distribution plate is snap-fitted with the lower water distribution plate, and the lower water distribution plate is snap-fitted with the bottom of the first groove.

The upper water distribution plate is provided with a strip-shaped water outlet hole, and a water channel is formed at a position of the lower water distribution plate corresponding to the strip-shaped water outlet hole.

Further, both ends of the water distribution plate are provided with water inlets, and the water inlets correspond to the water inlet holes.

Further, a flow guide groove is formed in an inner wall of a pump housing of the centrifugal pump and extends spirally along a rotation direction of the impeller, and a depth of the flow guide groove gradually increases from a side close to the impeller to a side away from the impeller.

Further, the water outlet hole is provided with a flow control valve, and the flow control valve is electrically connected with the centrifugal pump.

Further, the copper skived fin includes a sealing O-ring, copper fins and a connecting piece, the copper fins are arranged at the center of the connecting piece, a third groove is arranged between the copper fins and the connecting piece, and the sealing O-ring is arranged in the third groove.

Further, the surface of the copper skived fin is provided with a layer of graphene coating.

Further, the mesh gasket is made of rubber, and the mesh shape of the mesh gasket is arranged in parallel rectangles.

Further, an outer surface of the central housing is provided with a heat insulation layer, and the heat insulation layer is made of asbestos material.

The present disclosure has the following advantages:

In the embodiment of the present disclosure, aiming at the shortcomings in the existing technology that uneven distribution of water flow leads to poor heat dissipation effect and poor sealing performance between various components easily leads to water leakage, the present disclosure proposes a liquid-cooling cooler, including a central housing, a water distribution plate, a mesh gasket and a copper skived fin. The central housing is provided with a first groove, and the water distribution plate, and the mesh gasket and the copper skived fin are sequentially stacked in the first groove. The copper skived fin is fixedly connected with the central housing. A water outlet is formed at a middle position of a side of the water distribution plate facing the copper skived fin, a second groove is formed at a position of the water distribution plate corresponding to a mesh frame of the mesh gasket, and the mesh gasket is arranged in the second groove. When flowing out of the water outlet, a coolant flows to the center of the copper skived fin through the water outlet, is dispersed around the copper skived fin by the copper skived fin, and then flows back to the central housing. By arranging the copper skived fin, the coolant is evenly distributed, and a gap between the copper skived fin and the water distribution plate is isolated and sealed by the mesh gasket, preventing the coolant from flowing out midway, and ensuring that the coolant flows from the middle of the copper skived fin to its surrounding areas to prevent incomplete coverage of the coolant.

BRIEF DESCRIPTION OF THE DRAWINGS

To more clearly illustrate the technical solutions of the present disclosure, the accompanying drawings which need to be used in the description of the present disclosure will be briefly introduced below. Obviously, the drawings in the following description are merely some embodiments of the present disclosure. For those skilled in the art, other drawings may also be obtained according to these accompanying drawings without any creative effort.

Figure 1:
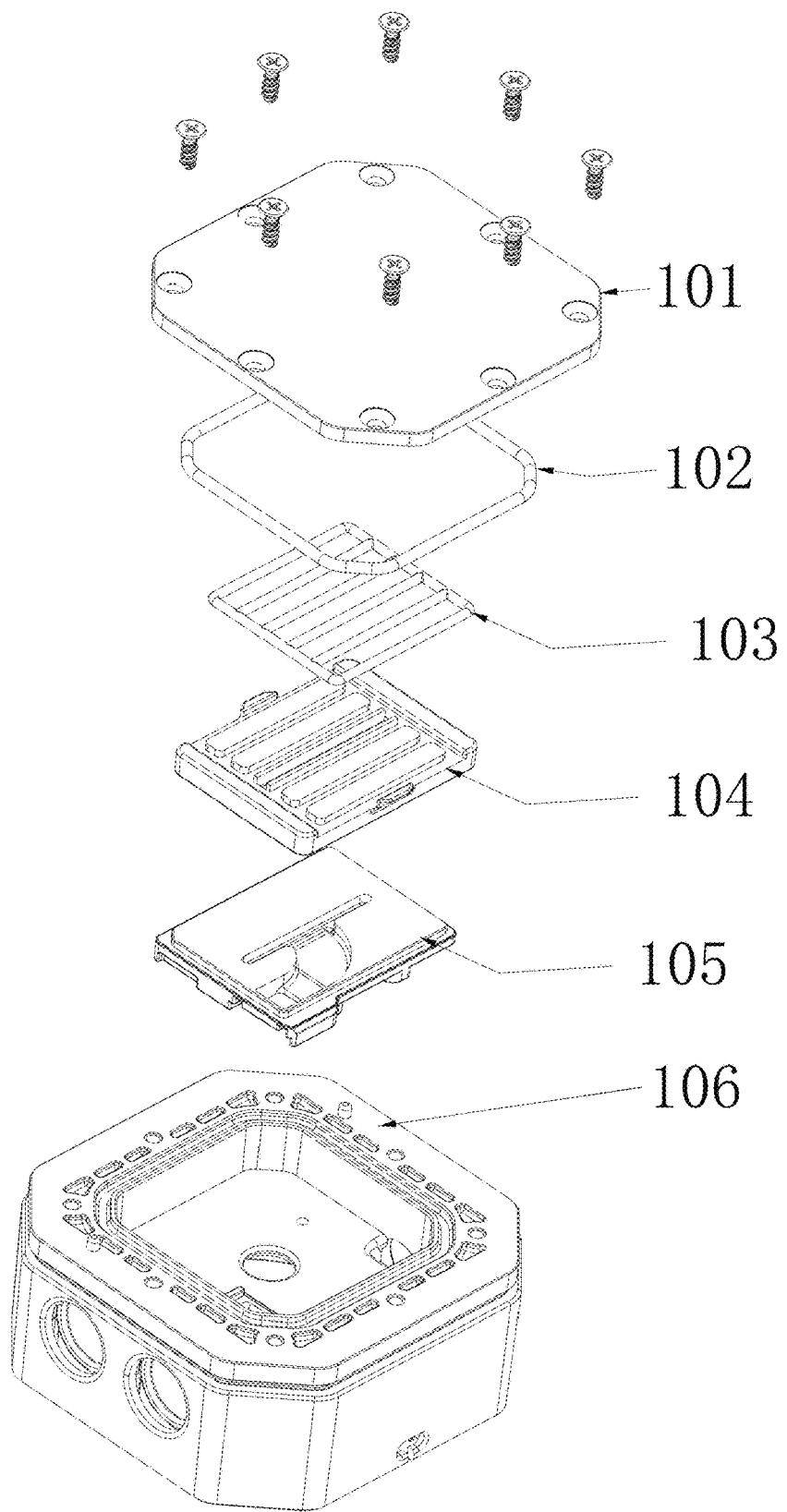
FIG. 1 is a schematic structural diagram of a liquid-cooling cooler provided in an embodiment of the present disclosure.

Description of reference numerals: 101. Copper skived fin; 102. Sealing O-ring; 103. Mesh gasket; 104. Upper water distribution plate; 105. Lower water distribution plate; 106. Central housing; 201. Copper fin; 202. Third groove; 203. Connecting piece; 204. Screw; 301. Water inlet.

DETAILED DESCRIPTION OF THE EMBODIMENTS

To make the objectives, features, and advantages of the present disclosure clearer and easier to understand, the present disclosure will be further described in detail below with reference to the accompanying drawings and specific implementations. Obviously, the described embodiments are merely part but not all of the embodiments of the present disclosure. Based on the embodiments in the present disclosure, all the other embodiments obtained by those skilled in the art without any creative effort shall fall within the protection scope of the present disclosure.

Through analysis of the existing technology, the inventor found that the existing liquid-cooling coolers has the following shortcomings: uneven distribution of water flow leads to poor heat dissipation effect; poor sealing performance between various components easily leads to water leakage; and relatively cumbersome assembly and maintenance of some liquid-cooling coolers increase the usage cost.

In the embodiment of the present disclosure, aiming at the shortcomings in the existing technology that the uneven distribution of water flow leads to poor heat dissipation effect and poor sealing performance between various components easily leads to water leakage, the present disclosure provides a liquid-cooling cooler, including a central housing, a water distribution plate, a mesh gasket and a copper skived fin. The central housing is provided with a first groove, and the water distribution plate, the mesh gasket and the copper skived fin are sequentially stacked in the first groove; the copper skived fin is fixedly connected with the central housing; a water outlet is formed at a middle position of a side of the water distribution plate facing the copper skived fin, a second groove is formed at a position of the water distribution plate corresponding to a mesh frame of the mesh gasket, and the mesh gasket is arranged in the second groove; and when flowing out of the water outlet, a coolant flows to the center of the copper skived fin through the water outlet, is dispersed around the copper skived fin by the copper skived fin, and then flows back to the central housing. By arranging the copper skived fin, the coolant is evenly distributed, and a gap between the copper skived fin and the water distribution plate is isolated and sealed by the mesh gasket, preventing the coolant from flowing out midway, and ensuring that the coolant flows from the middle of the copper skived fin to its surrounding areas to prevent incomplete coverage of the coolant.

Figure 2:
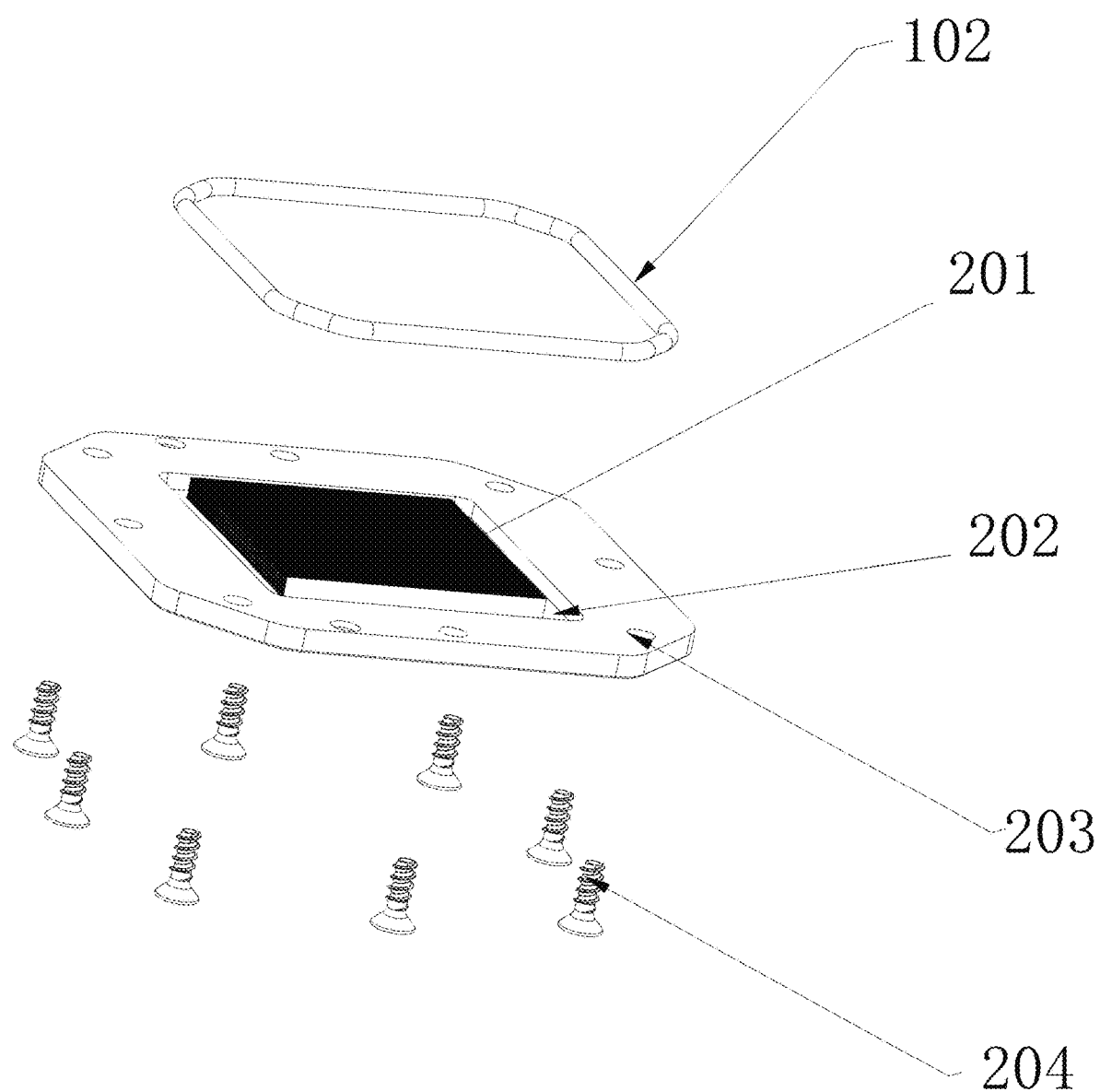
FIG. 2 is a schematic structural diagram of a copper skived fin of a liquid-cooling cooler provided in an embodiment of the present disclosure.
Figure 3:
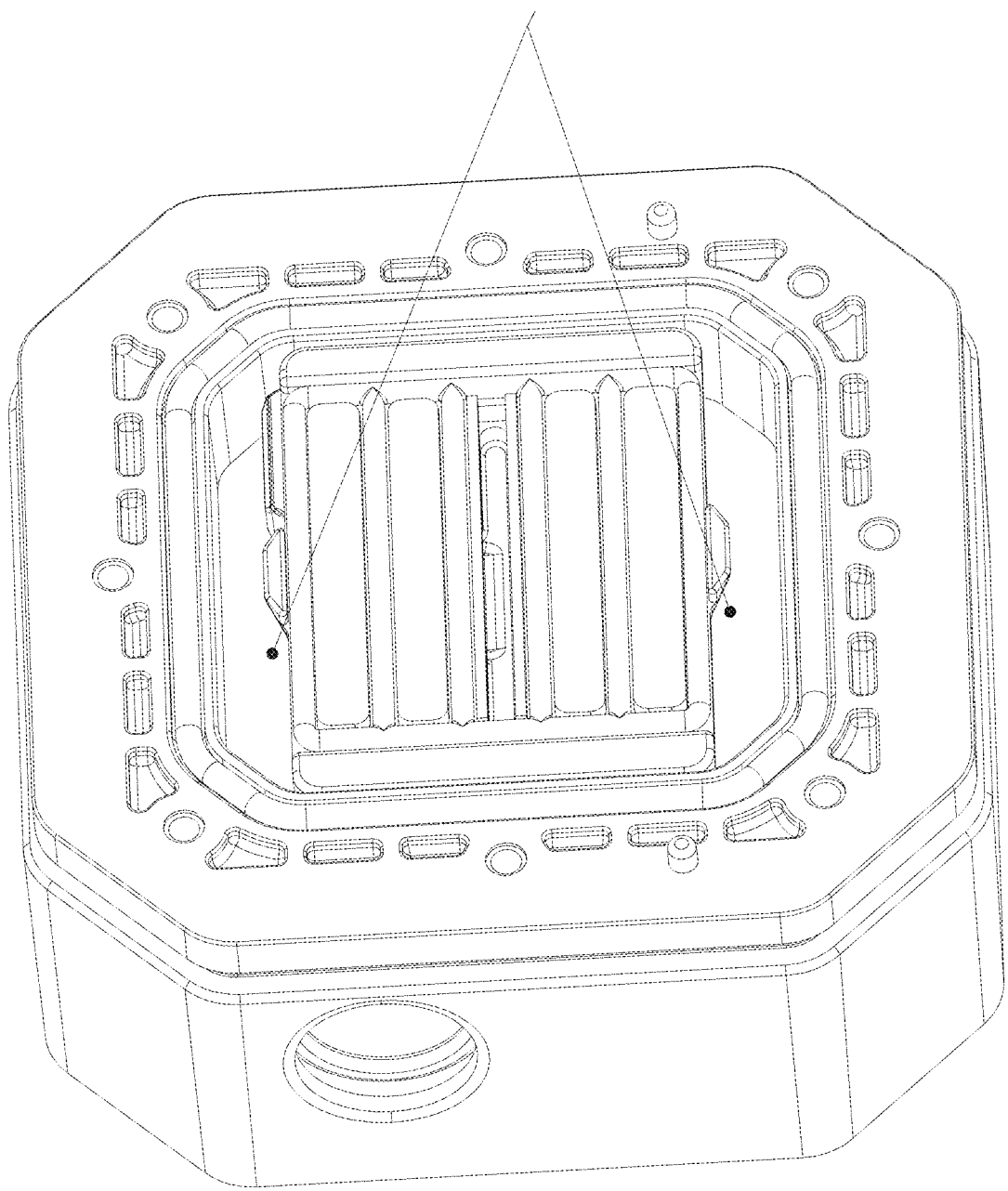
FIG. 3 is a schematic structural diagram of a water inlet position of a liquid-cooling cooler provided in an embodiment of the present disclosure.

Referring to FIGS. 1-3, a liquid-cooling cooler is shown, including a central housing 106, a water distribution plate, a mesh gasket 103, and a copper skived fin 101.

The central housing 106 is provided with a first groove, the water distribution plate, the mesh gasket 103, and the copper skived fin 101 are sequentially stacked in the first groove, and the copper skived fin 101 is fixedly connected with the central housing 106.

A water outlet is formed at a middle position of a side of the water distribution plate facing the copper skived fin 101, a second groove is formed at a position of the water distribution plate corresponding to a mesh frame of the mesh gasket 103, and the mesh gasket 103 is arranged in the second groove.

When flowing out of the water outlet, a coolant flows to the center of the copper skived fin 101 through the water outlet, is dispersed around the copper skived fin 101 by the copper skived fin 101, and then flows back to the central housing 106.

It should be noted that the central housing 106 serves as a basic bearing component of the cooler, and the first groove is an inwardly recessed accommodating space that provides an installation and positioning reference for other components. The shape and size of the first groove are adapted to overall contours of the water distribution plate and the copper skived fin 101, ensuring that the two can be stably stacked and placed. The water distribution plate, the mesh gasket 103, and the copper skived fin 101 are sequentially stacked in the first groove of the central housing 106. The copper skived fin 101 is fixedly connected with the central housing 106 (such as by screw fastening, welding, or snap locking). Through the fixing of the copper skived fin 101, the stacked mesh gasket 103 and the water distribution plate are indirectly pressed in the first groove, thereby avoiding component displacement caused by vibration or water flow impact during use.

The water distribution plate is a core component that controls the direction of water flow. A water outlet is formed at a middle position of a side of the water distribution plate facing the copper skived fin 101, and this water outlet serves as a channel through which the coolant flow towards the copper skived fin 101. Meanwhile, a second groove is formed at a position of the water distribution plate corresponding to a mesh frame of the mesh gasket 103, and the mesh gasket 103 is embedded in this second groove, ensuring precise locating of the mesh gasket 103 and preventing its deformation or shift under the impact of the water flow.

The mesh gasket 103 is arranged in the second groove of the water distribution plate and located between the water distribution plate and the copper skived fin 101. The mesh structure of the mesh gasket 103 can not only allow the coolant to flow from the water outlet of the water distribution plate to the copper skived fin 101, but also enhance the sealing performance between the water distribution plate and the copper skived fin 101 through the mesh frame.

The copper skived fin 101 is made of copper, and its structural design needs to adapt to the requirements of water flow dispersion by taking advantage of high thermal conductivity of copper. When the coolant flows from the center to the copper skived fin 101, the copper skived fin 101 evenly disperses the concentrated water flow to the surrounding areas with its tooth-shaped or flow-directing structure. This maximizes the contact area with the coolant, enabling fast heat transfer.

A liquid-cooling cooler in this exemplary embodiment will be further described below.

In an embodiment of the present disclosure, the central housing 106 includes a housing body and a centrifugal pump. The housing body is provided with a water inlet hole and a water outlet hole, wherein the water inlet hole corresponds to the center of an impeller of the centrifugal pump, and the water outlet hole corresponds to the water outlet.

It should be noted that the housing body serves as a main frame that supports other components, and its interior needs to be designed with a space to accommodate the installation of the centrifugal pump and an internal channel to guide the flow of the coolant. The housing body is usually made of a material with certain strength and corrosion resistance to ensure the stability and service life of the overall structure. As a core power component that drives the coolant circulation, the centrifugal pump is integrated into the central housing, replacing an external pump body that traditional liquid-cooling coolers may rely on, thereby making the overall structure more compact. The centrifugal pump generates a centrifugal force through the rotation of the impeller, drawing the coolant from a low-pressure area and discharging it from a high-pressure area, thereby providing continuous power for the coolant circulation of the entire heat dissipation system.

When the centrifugal pump is in operation, the coolant is drawn through the water inlet hole. After being pressurized by the rotation of the impeller, the coolant is delivered to the water outlet hole through the internal channel of the central housing 106, then flows into the water outlet of the water distribution plate, and finally enters the copper skived fin 101 to participate in heat dissipation. The coolant, after completing heat exchange, flows back to the central housing 106 from around the copper skived fin, forming a closed-loop circulation of drawing→pressurization→output→return.

In an embodiment of the present disclosure, the water distribution plate includes an upper water distribution plate 104 and a lower water distribution plate 105.

The upper water distribution plate 104 is snap-fitted with the lower water distribution plate 105, and the lower water distribution plate 105 is snap-fitted with the bottom of the first groove.

The upper water distribution plate 104 is provided with a strip-shaped water outlet hole, and a water channel is arranged at a position of the lower water distribution plate 105 corresponding to the strip-shaped water outlet hole.

It should be noted that the upper water distribution plate 104 and the lower water distribution plate 105 are combined using a snap-fit connection, which eliminates the need for additional fasteners. This not only ensures the firmness of connection but also facilitates quick assembly and later disassembly for maintenance. At the same time, the tightness of the snap-fit connection can reduce the risk of water leakage between the two layers. The lower water distribution plate 105 is directly snap-fitted to the bottom of the first groove of the central housing 106. Through this connection method, the entire water distribution plate is fixed at a preset position of the central housing 106, avoiding displacement during the flow of coolant or device vibration, ensuring precise alignment of the water outlet direction of the water distribution plate with the central position of the copper skived fin 101, and providing a foundational guarantee for the stability of the water flow path.

A strip-shaped water outlet hole is formed on a side of the upper water distribution plate 104 facing the copper skived fin 101. The strip-shaped hole is designed to increase the coverage width of water flow in each discharge, allowing the coolant to initially form a uniform water curtain as it flows out, rather than a concentrated columnar water flow. This lays a foundation for the subsequent dispersion effect of the copper skived fin 101. Meanwhile, the length and number of the strip-shaped hole can be designed according to heat dissipation requirements, allowing flexible adjustment of the water flow rate and distribution range. A water channel is arranged at a position of the lower water distribution plate 105 corresponding to the strip-shaped water outlet hole, and guides the coolant flowing into the water distribution plate from the central housing 106 to the strip-shaped water outlet hole in a concentrated manner, avoiding the water flow from dispersing inside the water distribution plate in an unorganized manner. The direction of the water channel is aligned with the strip-shaped water outlet hole, ensuring that the coolant can flow out of the strip-shaped hole with stable pressure and flow, and reducing energy loss caused by turbulent water flow.

The water distribution plate serves as an intermediate hub for the coolant to flow from the central housing to the copper skived fin, and the coordinated structure of its upper and lower layers forms a water flow control logic from concentrated flow to uniform output.

In an embodiment of the present disclosure, both ends of the water distribution plate are provided with water inlets 301, and the water inlets 301 correspond to the water inlet holes.

It should be noted that the positions of the water inlets 301 on the water distribution plate are precisely aligned with the positions of the water inlet holes on the central housing 106. When the water distribution plate is installed in the first groove of the central housing, the water inlets 301 can be perfectly aligned with the water inlet holes to form a continuous channel, ensuring that the coolant can be smoothly recycled to the central housing 106. The sizes of the water inlets 301 are adapted to the sizes of the water inlet holes, therefore, the coolant will not leak at the connection due to the oversized water inlet 301, and the flow of the coolant will not be restricted due to the undersized water inlet 301. This guarantees that a sufficient amount of coolant enters the central housing per unit time, meeting the circulation requirement of the coolant.

In an embodiment of the present disclosure, a flow guide groove is formed in an inner wall of a pump housing of the centrifugal pump, and extends spirally along a rotation direction of the impeller, and a depth of the flow guide groove gradually increases from a side close to the impeller to a side away from the impeller.

It should be noted that the impeller, when rotating, drives the surrounding coolant to perform circular motion, and the water flow tends to move in a tangential direction. The spiral flow guide groove can accommodate this movement trend to smoothly guide the water flow from the area near the impeller to a water outlet area of the pump housing, reducing the turbulence and energy loss caused by sudden changes in the motion direction of the water flow. Near the impeller, the water flow is just driven by the impeller, so its speed and pressure are relatively low. At this time, the flow guide groove is shallow, which can restrain the water flow to a certain extent, enabling the water flow to quickly gain kinetic energy. As the water flow moves away from the impeller, its speed and pressure gradually increase, and the depth of the flow guide groove gradually increases to provide more space for the water flow, avoiding compressing or colliding the water flow due to limited space, thereby reducing pressure loss, and allowing the water to flow more smoothly to the outlet of the pump housing.

In an embodiment of the present disclosure, the water outlet hole is provided with a flow control valve, and the flow control valve is electrically connected with the centrifugal pump.

It should be noted that when the liquid-cooling cooler is in operation, the flow control valve can adjust its opening degree according to actual heat dissipation requirements. For example, when the device under heavy load and generates a large amount of heat, the flow control valve increases its opening degree to allow more coolant to flow through the water outlet hole into subsequent heat dissipation components; and when the device is under low load and generates less heat, the flow control valve reduces its opening degree to decrease the flow rate of the coolant. The rotational speed of the centrifugal pump affects the output power of the coolant, and changes in the opening degree of the flow control valve are fed back to a control system of the centrifugal pump, enabling the centrifugal pump to adjust its rotational speed according to flow rate requirements. If the flow control valve opens wider, the centrifugal pump can increase its rotational speed accordingly to provide greater power, ensuring sufficient coolant to pass through; and if the flow control valve closes more, the centrifugal pump can reduce its rotational speed to avoid energy waste. This linkage mechanism achieves a precise match between flow rate and power.

The flow control valve can regulate the flow rate of the water outlet hole, thereby stabilizing the pressure inside the central housing 106 and subsequent pipelines. This prevents excessive system pressure caused by the centrifugal pump continuously operating at a high speed, and reduces the risks of pipeline leakage and component damage. Meanwhile, this also prevents inadequate pressure caused by insufficient flow rate, which could otherwise affect the normal circulation of the coolant.

In an embodiment of the present disclosure, the copper skived fin 101 includes a sealing O-ring 102, copper fins 201, and a connecting piece 203. The copper fins 201 are arranged at the center of the connecting piece 203, a third groove 202 is arranged between the copper fins 201 and the connecting piece 203, and the sealing O-ring 102 is arranged in the third groove 202.

It should be noted that when the coolant flows from the center to the surrounding areas, the copper fins 201 quickly absorb heat transferred from the device and dissipate the heat through heat exchange with the coolant, which makes the copper fins 201 serving as a core executive component in the heat dissipation process. The connecting piece 203 serves as an installation carrier for the copper fins 201, and fixes the copper fins 201 at a preset position of the central housing 106 to ensure that the copper fins 201 are aligned with the water outlet of the water distribution plate. Meanwhile, the connecting piece 203 is also responsible for connecting and attaching to the device to be cooled, facilitating heat exchange. The sealing O-ring 102 is precisely attached to a connection between the copper fins 201 and the connecting piece 203, preventing the coolant from leaking through side gaps of the copper fins 201 as the coolant spreads outward from the center of the copper fins 201, and preventing the coolant from directly seeping into the gap between the connecting piece 203 and the central housing 106, which could cause disordered flow and reduce the heat dissipation area, or even affect normal operation of other components.

In an embodiment of the present disclosure, the surface of the copper skived fin 101 is provided with a layer of graphene coating.

It should be noted that the addition of the graphene coating can further improve the overall thermal conductivity of the copper skived fin 101. When the heat generated by the device is transferred to the copper skived fin 101, the graphene coating can quickly conduct the heat from the interior of the copper skived fin to its surface. This accelerates the exchange of heat with the flowing coolant, effectively shortening the heat transfer path, and reducing heat accumulation inside the copper skived fin. Meanwhile, the graphene coating accelerates the conduction of heat to the surface, and its surface properties enhances the heat exchange effect with the coolant. On one hand, the coating makes the surface of the copper skived fin smoother, reducing the resistance to the coolant during flowing, and allowing the coolant to contact with the surface more smoothly; and on the other hand, the heat exchange coefficient between graphene and the coolant is relatively high, enabling more efficient transfer of the heat on the surface to the coolant, thereby improving the efficiency of the entire heat dissipation process. Graphene has excellent chemical stability and corrosion resistance, and a protective film can be formed on the surface of the copper skived fin 101, preventing the copper material from being oxidized or corroded during long-term contact with the coolant. This helps maintain the thermal conductivity and structural integrity of the copper skived fin, prolonging its service life.

In an embodiment of the present disclosure, the mesh gasket 103 is made of rubber, and has rectangular meshes arranged in parallel.

It should be noted that rectangular meshes are arranged in parallel, forming a plurality of regular water flow channels. When flowing out of the water outlet of the water distribution plate, the coolant first passes through the rectangular meshes of the mesh gasket 103. These meshes can play a preliminary role in dispersing and guiding the water flow, making it more evenly distributed towards the central area and the surrounding areas of the copper skived fin. Compared with meshes of other shapes, the long sides of the rectangular meshes can guide the water flow in specific directions, reducing water flow turbulence, and allowing more coolant to contact with the copper skived fin 101 in an organized manner, thereby improving the heat dissipation efficiency. The frames of the rectangular meshes have a certain strength, and the parallel-arranged structure enables the overall mesh gasket 103 to have good compression resistance. When the water distribution plate, the mesh gasket 103, and the copper skived fin 101 are sequentially stacked, the mesh gasket 103 is subject to pressure from the upper and lower components. The frames of the rectangular meshes can distribute this pressure, preventing the mesh gasket 103 from excessive deformation, which could otherwise affect its sealing and water flow guidance functions. At the same time, this arrangement also facilitates the matched installation of the mesh gasket 103 into the second groove at the position of the water distribution plate corresponding to the mesh frame, ensuring no shift in the mesh gasket 103 during use.

In an embodiment of the present disclosure, an outer surface of the central housing 106 is provided with a heat insulation layer, and the heat insulation layer is made of asbestos material.

It should be noted that in environments with low ambient temperatures, the coolant inside the central housing 106 maintains a relatively high temperature, and condensation may occur on the surface of the housing due to temperature differences, meaning that water vapor in the air condenses into water droplets on the surface of the housing. If these water droplets drip onto other components of the device, the components may be caused to become damp, corroded, or even affect the electrical performance of the device. The presence of the heat insulation layer can reduce the temperature difference between the surface of the central housing and the external environment, thereby reducing the probability of condensation and ensuring safe operation of the device. At the same time, the asbestos heat insulation layer can lower the temperature of the outer surface of the central housing 106, making it safer for operators to touch or approach the cooler, and improving the operating environment of the device.

Although preferred embodiments of the embodiments of the present disclosure have been described, those skilled in the art can make additional modifications and alterations to these embodiments once the fundamental inventive concept is understood. Therefore, the appended claims are intended to be construed as including the preferred embodiments and all the modifications and variations that fall within the scope of the embodiments of the present disclosure.

Finally, it should be noted that relational terms such as "first," "second" and the like used herein are merely used to distinguish one entity or operation from another entity or operation, and do not necessarily require or imply any actual relationship or sequence between these entities or operations. Furthermore, the terms "include," "comprise" or any other variations thereof are intended to cover a non-exclusive inclusion, allowing a process, method, item, or terminal device that includes a series of elements to not only include those elements but also other elements that are not explicitly listed, or elements inherent to the process, method, item, or terminal device. Without further restrictions, an element defined by the phrase "including a . . . " does not exclude other identical elements that may exist in the process, method, item, or terminal device that includes the element.

The above provides a detailed description of the liquid-cooling cooler provided by the present disclosure. Specific examples are used herein to illustrate the principles and implementations of the present disclosure. The explanation of the above embodiments is merely intended to help understand the method and core ideas of the present disclosure. Meanwhile, for those skilled in the art, variations in the specific implementations and application scopes will be apparent based on the ideas of the present disclosure. Therefore, the content of this specification should not be construed as limiting the present disclosure.

What is claimed is:

1. A liquid-cooling cooler, comprising a central housing, a water distribution plate, a mesh gasket and a copper skived fin; wherein:
    the central housing is provided with a first groove, the water distribution plate, the mesh gasket and the copper skived fin are sequentially stacked in the first groove, and the copper skived fin is fixedly connected with the central housing;
    a water outlet is formed at a middle position of a side of the water distribution plate facing the copper skived fin, a second groove is formed at a position of the water distribution plate corresponding to a mesh frame of the mesh gasket, and the mesh gasket is arranged in the second groove; and
    when flowing out of the water outlet, a coolant flows to the center of the copper skived fin through the water outlet, is dispersed around the copper skived fin by the copper skived fin, and then flows back to the central housing.

2. The liquid-cooling cooler according to claim 1, wherein the central housing comprises a housing body and a centrifugal pump, the housing body is provided with a water inlet hole and a water outlet hole, the water inlet hole corresponds to the center of an impeller of the centrifugal pump, and the water outlet hole corresponds to the water outlet.

3. The liquid-cooling cooler according to claim 2, wherein the water distribution plate comprises an upper water distribution plate and a lower water distribution plate;
    the upper water distribution plate is snap-fitted with the lower water distribution plate, and the lower water distribution plate is snap-fitted with the bottom of the first groove; and
    the upper water distribution plate is provided with a strip-shaped water outlet hole, and a water channel is formed at a position of the lower water distribution plate corresponding to the strip-shaped water outlet hole.

4. The liquid-cooling cooler according to claim 3, wherein both ends of the water distribution plate are provided with water inlets, and the water inlets correspond to the water inlet holes.

5. The liquid-cooling cooler according to claim 3, wherein a flow guide groove is formed in an inner wall of a pump housing of the centrifugal pump and extends spirally along a rotation direction of the impeller, and a depth of the flow guide groove gradually increases from a side close to the impeller to a side away from the impeller.

6. The liquid-cooling cooler according to claim 3, wherein the water outlet hole is provided with a flow control valve, and the flow control valve is electrically connected with the centrifugal pump.

7. The liquid-cooling cooler according to claim 1, wherein the copper skived fin comprises a sealing O-ring, copper fins and a connecting piece, the copper fins are arranged at the center of the connecting piece, a third groove is arranged between the copper fins and the connecting piece, and the sealing O-ring is arranged in the third groove.

8. The liquid-cooling cooler according to claim 1, wherein the surface of the copper skived fin is provided with a layer of graphene coating.

9. The liquid-cooling cooler according to claim 1, wherein the mesh gasket is made of rubber, and has rectangular meshes arranged in parallel.

10. The liquid-cooling cooler according to claim 1, wherein an outer surface of the central housing is provided with a heat insulation layer, and the heat insulation layer is made of asbestos material.

* * * * *